United States Patent [19]

Leidich et al.

[11] 3,710,202

[45] Jan. 9, 1973

[54] HIGH FREQUENCY POWER TRANSISTOR SUPPORT

[75] Inventors: Arthur John Leidich, Max Edward Malchow, both of Flemington, N.J.

[73] Assignee: RCA Corp.

[22] Filed: Sept. 9, 1970

[21] Appl. No.: 70,632

[52] U.S. Cl. ............................317/234 R, 317/234 G

[51] Int. Cl. ..................................................H01l 5/00

[58] Field of Search.........................................317/234

[56] References Cited

UNITED STATES PATENTS

| | | | |
|---|---|---|---|
| 3,554,821 | 1/1971 | Caulton et al. | 156/3 |
| 3,387,190 | 6/1968 | Winkler | 317/234 |
| 3,428,911 | 2/1969 | Hambleton | 330/31 |
| 3,478,161 | 11/1969 | Carley | 174/52 |

OTHER PUBLICATIONS

IBM, (TDB), "Microelectronic Ceramic Substrate with Improved Voltage Distribution," Blodgett, Vol. 13, No. 3, Aug. 1970

*Primary Examiner*—John W. Huckert
*Assistant Examiner*—E. Wojciechowicz
*Attorney*—Glenn H. Bruestle

[57] ABSTRACT

A support for transistors operating at high frequencies includes an electrically insulating, heat conductive base member having a conductive pad, on which a transistor may be mounted, on a portion of one of its surfaces and a conductive ground plane on the remainder of that surface. An apertured, insulating plate member is bonded to the base member and has conducting areas thereon to which the active regions of the transistor may be coupled in a manner characterized by low parasitic reactances.

4Claims, 7 Drawing Figures

INVENTORS
Authur J. Leidich &
Max E. Malchow.
BY Robert P. Williams
ATTORNEY

INVENTORS
Arthur J. Leidich &
Max E. Malchow.
BY Robert P. Williams
ATTORNEY

INVENTORS
Arthur J. Leidich &
Max E. Malchow.
BY Robert P. Williams
ATTORNEY

HIGH FREQUENCY POWER TRANSISTOR SUPPORT

BACKGROUND OF THE INVENTION

This invention relates to supports for semiconductor devices which operate at high frequencies.

Many circuit applications require the operation of transistors at high frequencies, for example, at microwave frequencies. At these frequencies, the construction of the supporting housing or package and the manner of making electrical connections to the active regions of the transistor become of extreme importance. The package must have good thermal properties and low parasitic reactances. Parasitic inductances, such as emitter and base lead inductances, and resistive losses in the package can significantly degrade the power gain, bandwidth, and stability of the transistor.

Several low loss, low inductance packages or mounting subassemblies for high frequency transistors are known. One such package is the so-called coaxial package described in detail below with reference to FIG. 1. This package is mechanically strong, has good thermal properties, and has low parasitic inductances. For example, the emitter lead inductance and the base lead inductance of a typical coaxial package are on the order of 0.1 nanoHenry as compared with about 3 nanoHenries for a conventional transistor package of the type which has a header, on which the transistor chip is mounted and through which external emitter, base, and collector leads extend, and which has a can-shaped cap which encloses the transistor chip to isolate it from the ambient atmosphere. The coaxial package is relatively expensive, however.

SUMMARY OF THE INVENTION

The present transistor support includes an electrically insulating, heat conductive base member having a surface on which a high frequency transistor may be mounted. The base member also has a layerlike body of conductive material on the same surface. An insulating plate member is attached to the base member and supports conductive elements to which the active regions of the transistor may be coupled.

Lead inductance and loss characteristics of the present novel transistor support, in its embodiment as a transistor package, have been found to be about the same as those of the coaxial package. The present support is less than one-fifth as costly as the coaxial package to manufacture.

THE DRAWINGS

DETAILED DESCRIPTION

Figure 1:
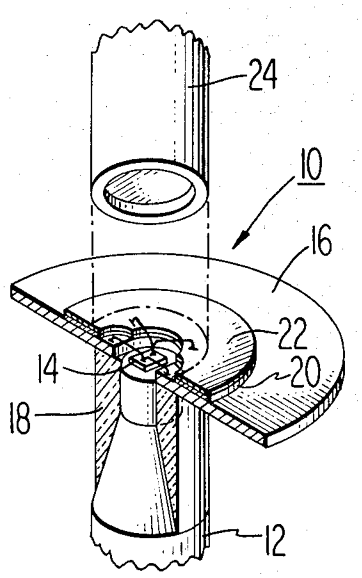
Fig. 1. (PRIOR ART)
FIG. 1 is a perspective view, partly broken away and partly in section of a prior art coaxial transistor package.

FIG. 1 illustrates a typical coaxial package 10, in accordance with the prior art. In the package 10, there is a collector stud 12 on which a transistor chip 14 is mounted. A metallic base disc 16 is supported in insulating relation to the collector stud 12 by means of an insulating sleeve 18. A ceramic disc 20, which is provided with a metallized top surface 22, is supported on the base disc 16. Multiple flying wire bonds to the base and emitter active regions of the transistor 14 extend from the transistor 14 to the base disc 16 and to the metallized coating on the disc 20, respectively, in the manner shown. The leads are attached by the known stitch bonding technique, and the result is low and relatively even power injection. The region over the transistor 14 and the bonds is closed by an emitter stud 24 which is electrically and mechanically coupled to the top surface 22 of the disc 20. As stated above, a typical value of lead inductance in this package is about 0.1 nanoHenry.

Figure 2:
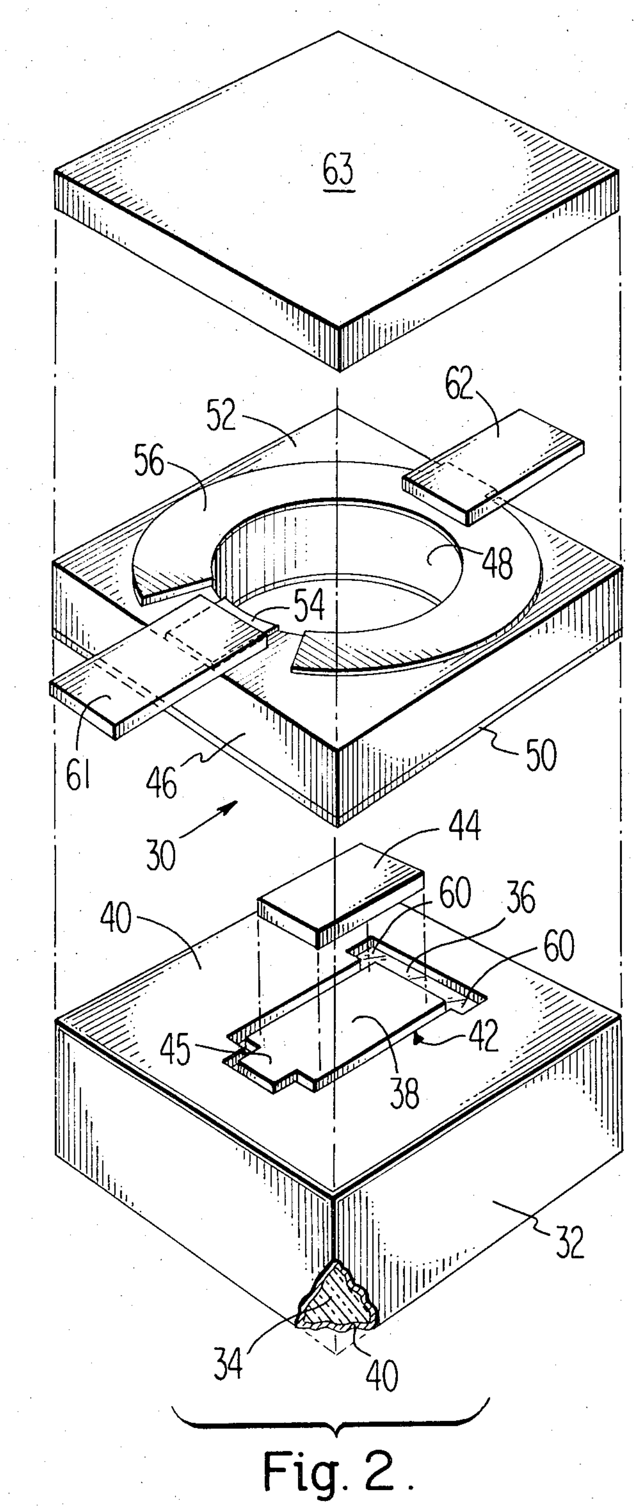
FIG. 2 is an exploded view, partly in section, of the present novel transistor support in its embodiment as a transistor package.
Figure 3:
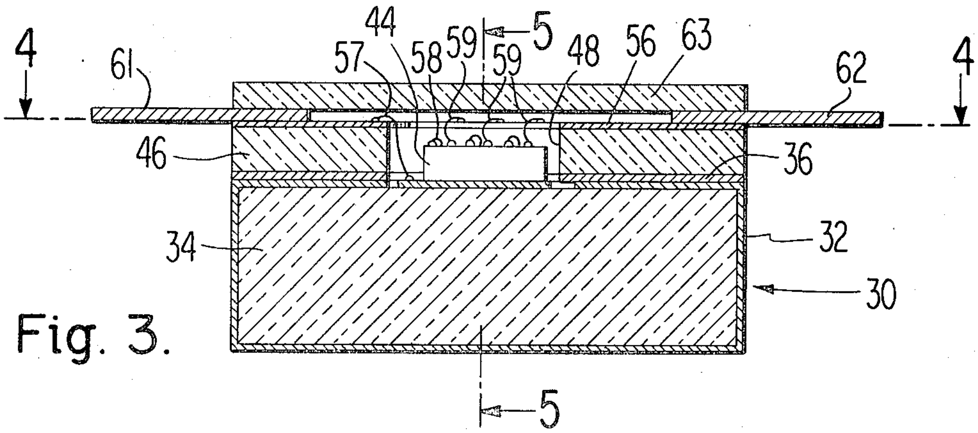
FIG. 3 is a vertical cross sectional view through the transistor package of FIG. 2.
Figure 4:
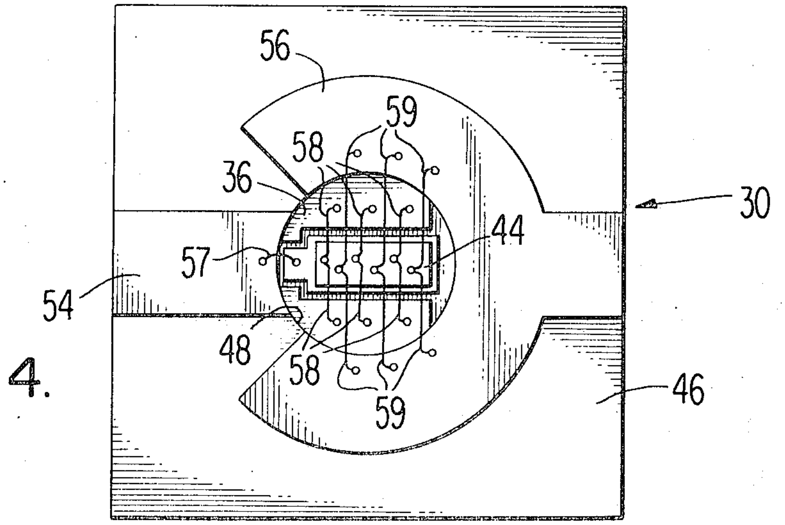
FIG. 4 is a section on line 4—4 of FIG. 3.
Figure 5:
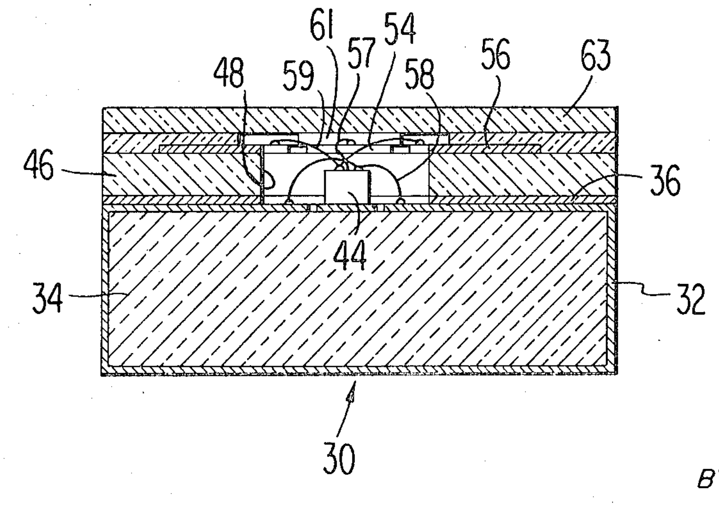
FIG. 5 is a section on line 5—5 of FIG. 3.

The present novel transistor support is shown in exploded view in FIG. 2 and in cross section in FIGS. 3 to 5 in its embodiment as a transistor package 30. The package 30 comprises a base member 32 which consists of, in this embodiment, a rectangular block 34 of electrically insulating and thermally conductive material such as beryllia. The block 34 has an upper, generally planar major surface 36 on which is a transistor mounting pad 38. The transistor mounting pad 38 may be formed, for example, by applying a molybdenum-manganese coating to the surface 36 of the block 34 and, thereafter, plating this coating with gold. The surface 36 also carries a second conductive layer-like body, 40, which preferably extends around the sides and bottom of the block 34. The body 40 may be formed at the same time as the transistor supporting pad 38, i.e., the block 34 may be completely metallized and thereafter the pad 38 and the body 40 may be established by etching the coating to form an isolation groove 42. The isolation groove 42 may have a distinctive shape, as shown, to aid in orienting the base member 32 with respect to the other elements of the package 30.

A transistor chip 44 is mounted on the support pad 38 in conventional fashion, e.g., by eutectic bonding. When contact to the lower side of the transistor chip 44 is required, the support pad 38 may have a tab portion 45, extending out from under the transistor chip 44, to which a wire may be bonded. The manner of connection of the active areas on the transistor chip 44 will be discussed in particular below.

The package 30 also has an insulating plate member 46, which has a central aperture 48 of adequate size and shape to accommodate the transistor chip 44 when the plate member 46 is assembled with the base member 32. Note FIG. 3 which shows the transistor chip 44 projecting into the aperture 48. The aperture need not be circular as shown and may take any desired shape as long as the tab portion 45 of the support pad 38 and two portions of the layerlike body 40 on opposite sides of the chip 44 are exposed when the device 44 and the plate member 46 are in assembled relation. The plate member 46 is formed of insulating material of high dielectric constant such as alumina in this embodiment. It is metallized on its lower surface with a conductive coating 50 which aids in bonding the parts together during assembly. On its top surface 52, the plate member 46 has at least two conductive areas 54 and 56 which may be formed by conventional metallizing procedures, like the coatings 38 and 40 on the member 32. One of the conductive areas, the area 56 in this case, should have portions on opposite sides of the opening 48, i.e. it should substantially surround the opening 48. These conductive areas act as transmission lines and the bottom metal on the plate member 46 in combination with the layerlike body 40 on the base member 32 acts as a ground plane for these lines.

In one technique for the assembly of the present device, the plate member 46 is first secured to the base member 32 in any desired manner, e.g., by brazing. The transistor chip 44 is then secured to the support pad 38. Wires are then ultrasonically or otherwise bonded to the active areas on the chip in the manner shown in FIGS. 3 to 5. In particular, a collector wire 57 may be attached at one of its ends to the tab 45 on the support pad and at the other of its ends to the conductive area 54 on the plate member 46. Several base and emitter wires should be used to distribute base and emitter current uniformly to all parts of these active regions. Thus, as shown, particularly in FIG. 4, a set of base wires 58 may be connected between the transistor chip 44 and those portions of the second layerlike body 40 which are exposed in the bottom of the aperture 48 on both sides of the chip 44. Similarly, a set of emitter wires 59 may be connected between the chip 44 and each of the conductive portions of the area 56 on both sides of the opening 48 in the plate member 46. This symmetrical arrangement of the wires results in low lead inductance and symmetrical power transfer, similar to the operation of the known coaxial package described above.

In an alternative method of assembly, the base wires 58 may be attached prior to assembly of the plate member 46. Here, the shape of the isolation groove may be used to guide the bonding machine operator to insure that bonds will be made which will be within the area of the aperture 48 when the parts are assembled. For example, the groove may have laterally extended portions 60, (FIG. 2), the ends of which define the outer limits of the bonding area for the wires 58.

For many applications, the structure as described thus far constitutes a useful subassembly which may then be employed in microwave hybrid integrated circuits. For example, the subassembly may be placed on a substrate of ceramic or other material together with other circuit elements.

The package 30 further includes ribbon like metal leads 61 and 62 which are secured, as by brazing, to the conductive areas 54 and 56 in electrical contact therewith. The package is completed by a cap member 63 which may be of ceramic material and which may be hermetically sealed over the opening 48 by conventional glass fritting procedures.

It is common in the art to provide input tuning capacitors where the transistors are being applied to special uses. The present novel support lends itself well to this purpose and a novel construction for combining the present support with input tuning capacitors is shown in FIGS. 6 and 7.

When capacitors are to be included, the support is made larger than is required for the package 30. Thus, as shown in FIG. 6, the distance between the periphery of the opening 48 and the edge of the base 32 is somewhat larger than that in FIG. 2. Consequently, space is provided to accommodate the capacitor structures.

Figure 6:
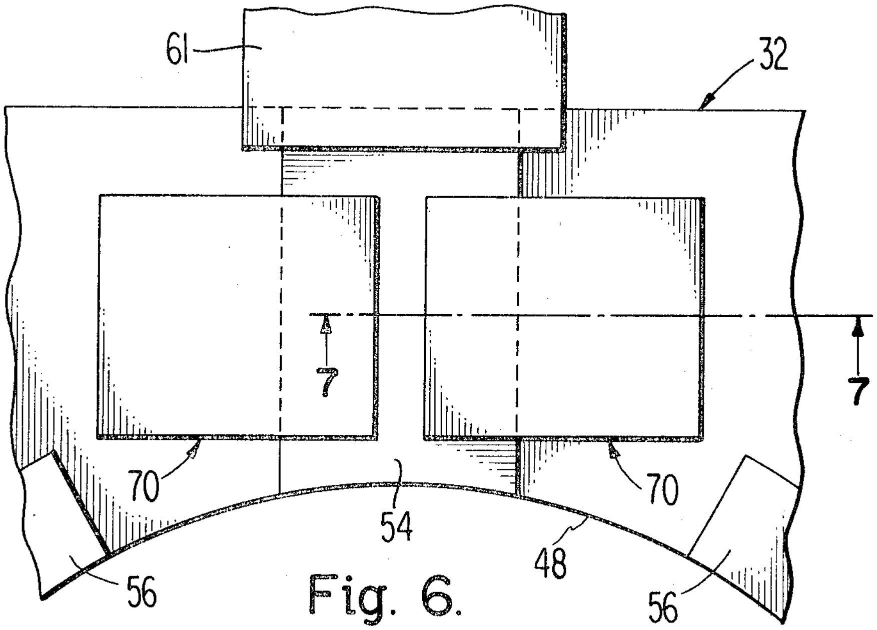
FIG. 6 is a partial plan view of a transistor support incorporating tuning capacitors.
Figure 7:
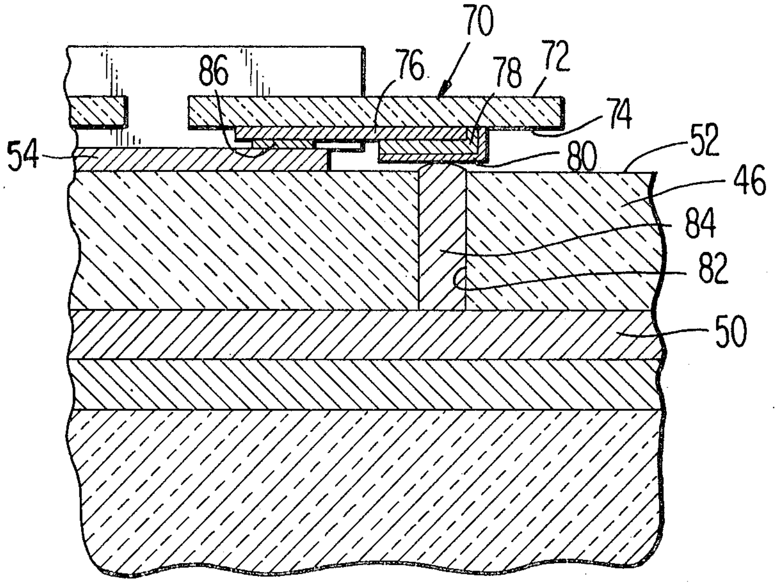
FIG. 7 is a cross section on line 7—7 of FIG. 6.

As shown in plan view in FIG. 6, capacitor devices 70 are located between the boundary of the opening 48 and the external lead 61. Each of the capacitors 70 is similarly constructed and includes, as shown in FIG. 7, an insulating substrate 72 of glass, ceramic or the like, on which the elements of the capacitor are supported. On the lower surface 74 of the substrate 72, there is a conductive layer 76 which forms one plate of the capacitor 70. Near one end of the plate 76 is an insulator 78 and on the insulator 78 is a conductive coating 80 which constitutes the other plate of the capacitor. The plates 76 and 80 and the insulator 78 may be formed by known thin film or thick film techniques.

The plate 80 of the capacitor 70 is coupled to the metallic coating 50 on the lower side of the plate member 46. For this purpose, the plate member 46 has a bore 82 extending therethrough at the location where connection is desired. The bore 82 is filled with conductive material 84, which may be solder and which extends slightly above the top surface 52 of the plate member 46. The plate 80 of the capacitor 70 may be connected to the conductive material 84 by heating these elements while in contact. At the same time, the plate 76 of the capacitor 70 may be soldered to the conductive element 54 on the plate member 46, as by means of a body of solder 86. The other capacitor is similarly mounted on the opposite side of the conductive means 54 as shown in FIG. 6. Two capacitors are preferred in order to balance the inductive effects of the capacitor plates and the conductive means 54.

Other elements like the capacitors 70 may be added to the device in a similar manner. Connections may be made from any such element through the plate member 46 by means of bores like the bore 82, so that complete microwave circuits are possible.

What is claimed is:

1. A support for a semiconductor device comprising:

an electrically insulating, heat conductive base member having a surface, a layer of conductive material on said surface adapted to have said device secured thereto in projecting relationship to said base member, said layer having an exposed portion when said device is secured thereto, a second layer of conductive material on said surface of said base member, separate from the first mentioned layer, said second layer covering substantially all of said surface of said base member not covered by said first mentioned layer, and an insulating plate member having opposed surfaces, one of said opposed surfaces being secured to said base member, said plate member having an opening extending therethrough of sufficient dimensions to accommodate said device and being of such a shape and size that said portion of said first mentioned layer and two portions of said second layer on opposite sides of said device are exposed within said opening when said device and said plate member are in place, said two portions of said second layer being adapted to have connector wires attached thereto, the other of said opposed surfaces having thereon at least one conducting area having portions on opposite sides of said opening.

2. A sub-assembly of a power transistor adapted to be operated at microwave frequencies and support means therefor comprising:

a base member of electrically insulating, heat conductive material having a planar surface, a first layer of conductive material on said surface, a transistor chip, having emitter, base and collector regions secured to said first layer of conductive material, one of the regions of said chip being electrically coupled to said first layer, a portion of said layer being exposed when said chip is in place, a second layer of conductive material on said surface, separated from said first layer and extending over substantially all of the remainder of said surface, an insulating plate member having opposed surfaces, one of said surfaces being secured to said base member, said plate member having an opening extending therethrough of such shape and size that said portion of said first layer and two portions of said second layer on opposite sides of said device are exposed within said opening when said plate member is secured to said base member, the other of said plate surfaces having at least two conducting areas thereon, one of which areas has portions on opposite sides of said opening, a plurality of conductors extending from another of the active regions of said device to said one of said conducting areas on said plate member, said conductors extending to each of said portions on opposite sides of said opening, a second plurality of conductors joining the remaining active regions of said transistor to said second layer on said base member and extending to each of said two portions of said second layer, and at least one conductor joining said first layer on said base member to the other of said conducting areas on said plate member.

3. A sub-assembly as defined in claim 2 further comprising input tuning means comprising:

means defining an aperture extending through said plate member at a location adjacent to one of said conductive areas thereon, conductive means filling said aperture, and a capacitor electrically coupled between said conductive means in said aperture and said one conductive area.

4. A sub-assembly as defined in claim 3 further comprising:

means defining a second aperture extending through said plate member at a location adjacent to said one of said conductive areas on the opposite side thereof from the first mentioned aperture, conductive means filling said second aperture, and a second capacitor electrically coupled between said conductive means in said second aperture and said one conductive area.

* * * * *